United States Patent [19]
Ohta

[11] Patent Number: 5,525,551
[45] Date of Patent: Jun. 11, 1996

[54] METHOD FOR FORMING INSULATING FILM IN SEMICONDUCTOR DEVICE USING A TEOS OR HMDS PRE-TREATMENT

[75] Inventor: Hiroyuki Ohta, Kawasaki, Japan

[73] Assignee: Fujitsu Limited, Kawasaki, Japan

[21] Appl. No.: 255,727

[22] Filed: Jun. 7, 1994

[30] Foreign Application Priority Data

Sep. 20, 1993 [JP] Japan .................................. 5-233800

[51] Int. Cl.$^6$ .................................................. H01L 21/205
[52] U.S. Cl. .................................................. 437/238; 437/946
[58] Field of Search .................................. 437/238, 946; 427/444

[56] References Cited

U.S. PATENT DOCUMENTS

| | | | |
|---|---|---|---|
| 4,872,947 | 10/1989 | Wang et al. | 156/643 |
| 5,051,380 | 9/1991 | Maeda et al. | 437/238 |
| 5,290,736 | 3/1994 | Sato et al. | 437/238 |
| 5,304,398 | 4/1994 | Krusell et al. | 427/255.3 |
| 5,393,708 | 2/1995 | Hsia et al. | 437/238 |

FOREIGN PATENT DOCUMENTS

| | | |
|---|---|---|
| 54-51479 | 4/1979 | Japan . |
| 54-51478 | 4/1979 | Japan . |
| 3-184320 | 8/1991 | Japan . |
| 4-38829 | 2/1992 | Japan . |
| 4-92427 | 3/1992 | Japan . |

OTHER PUBLICATIONS

S. Wolf, "Silicon Processing for the VLSI Era", vol. 1 Process Technology, pp. 194, 184, (1986).

Primary Examiner—George Fourson
Assistant Examiner—Thomas G. Bilodeau
Attorney, Agent, or Firm—Armstrong, Westerman, Hattori, McLeland & Naughton

[57] ABSTRACT

The present invention relates to a method for forming a silicon oxide film on a substrate by the thermal chemical vapor deposition method (thermal CVD method) using a gas mixture of ozone ($O_3$) and tetraethoxyorthosilicate (TEOS). It is an object of the present invention to provide a method for forming an insulating film in a semiconductor device, in which anomalous deposition of the film at a step portion (a portion of difference in level) is prevented and the film contains less moisture and less organic matter and is superior in smoothness. The present invention includes the steps of exposing the depositing surface of the substrate 14 to tetraethoxyorthosilicate in the absence of oxygen and ozone at the elevated temperature and forming an oxide film 15 on the substrate 14 by the thermal CVD method using a gas mixture of ozone ($O_3$) and tetraethoxyorthosilicate at a deposition temperature. In a second embodiment HMDS is substituted for TEOS in the pretreatment step.

11 Claims, 10 Drawing Sheets

METHOD FOR FORMING INSULATING FILM IN SEMICONDUCTOR DEVICE USING A TEOS OR HMDS PRE-TREATMENT

BACKGROUND OF THE INVENTION

1. Field of the Invention

The present invention relates to a method for forming an insulating film in a semiconductor device, particularly to a method for forming a silicon oxide ($SiO_2$) film on a substrate by the thermal chemical vapor deposition method (hereinafter referred to as a thermal CVD method) using a mixed gas of ozone ($O_3$) and tetraethoxysilane (TEOS).

2. Description of the Prior Art

In recent years, forming further piled multilayer and making patterns finer is desired according to further improvement of an integration level in a semiconductor device. Thus, improvements of coverage and planarization have been made against an insulating film covering interconnection layers. As a method to attain them, a method for forming an $SiO_2$ film by the thermal CVD method using a gas mixture of $O_3$+TEOS is attracting attention. In this case, a gas mixture containing $O_3$ at a fixed ratio in $O_2$ is used as an $O_3$ source.

However, the quality and shape of an $SiO_2$ film formed by the above film forming method are greatly affected due to the type of a backing insulating film exposed at a depositing surface and the mixture ratio of a reaction gas.

When the backing insulating film is an $SiO_2$ film formed by a plasma chemical vapor deposition method (hereinafter referred to as a plasma CVD method) using silane, the coverage and smoothness are considerably improved.

In particular, however, when a backing insulating film 3 shown in FIG. 1A is an $SiO_2$ film formed by the pasma CVD method using a gas mixture of $O_2$+TEOS or a silicon nitride (SiN) film, an $SiO_2$ film 4 formed on the backing insulating film 3, as shown in FIG. 1B, is hardly deposited on a corner 5 of an interconnection layer 2 or the like to cause a notch or hollow 6. Moreover the density of the $SiO_2$ film 4 is deteriorated and it results in soak of exterior moisture into the $SiO_2$ film 4.

Therefore, soak of exterior moisture or the like may cause the interconnection layer 2 formed on a silicon substrate 1 to corrode or a leak current of a transistor (which is not illustrated) to increase. Moreover, as shown in FIG. 1B, smoothness degrades because a ruggedness 7 occasionally breeds on a surface.

To solve these problems, there is known a method for forming a film under a condition in which $O_3$ is contained in $O_2$ at a low concentration, for example, at approx. 1%.

However, according to the result of an examination using FTIR (Fourier Transform Infrared Spectroscopy), it is found that a larger amount of moisture is contained in the formed $SiO_2$ film and also organic matter or the like in a reaction gas remains in the film when an $SiO_2$ film is formed at a low $O_3$ concentration. Moreover, according to the result of an examination using TDS (Thermal Disorption Spectroscopy), it is also found that the desorbing amount of the residue is large. These factors may cause an interconnection layer to corrode or a leak current of a transistor to increase.

When a backing insulating film is an $SiO_2$ film formed by the plasma CVD method using a gas mixture of $O_2$+TEOS or an SiN film, there is used a method such that a plasma of a oxygen gas is applied to the backing insulating film to reform the depositing surface of the backing insulating film and thereafter a film is formed on the backing insulating film. This method improves the smoothness of the $SiO_2$ film formed by the thermal CVD method using a gas mixture of $O_3$+TEOS.

However, when a plasma is applied to the backing insulating film, an electrical charge build-up occurs and may cause a semiconductor device to be ruined through a dielectric breakdown or the like. Moreover, damage is induced on a silicon substrate due to ion bombardment and thereby a device such as a transistor may be deteriorated.

SUMMARY OF THE INVENTION

It is an object of the present invention to provide a method for forming an insulating film in a semiconductor device, which makes it possible to prevent anomalous deposition at a step portion (a portion of difference in level) or the like and form a film containing less moisture and less organic matter and being superior in smoothness.

In the case of the method of the present invention for forming an insulating film in a semiconductor device, the depositing surface of a substrate is exposed to TEOS while heating the substrate before forming an $SiO_2$ film on the substrate by the thermal CVD method using a gas mixture of ozone ($O_3$) and tetraethoxysilane (TEOS).

The thermal CVD is a method such that a gas mixture of $O_3$ and TEOS reaches the surface of a substrate kept at a deposition temperature, these reaction gases react on the surface of the substrate at the temperature, and an $SiO_2$ film is deposited on the surface. Because the deposition by the thermal CVD using a gas mixture of $O_3$+TEOS results from such a surface reaction, the reaction greatly depends on the property of the depositing surface of the substrate.

Because the present invention reforms the depositing surface of a substrate by the pretreatment using TEOS, the uniformity of the depositing reaction of an $SiO_2$ film is improved.

Therefore, it is possible to improve the flatness without decreasing the $O_3$ concentration in $O_2$.

Thereby, an anomalous deposition of an $SiO_2$ film at a step portion of a substrate is prevented and an $SiO_2$ film containing less moisture and less organic matter and being superior in flatness is formed.

Even if a backing insulating film is an $SiO_2$ film formed by the plasma CVD method using a gas mixture of $O_2$+TEOS or an SiN film, it is possible to solve the problem of the prior art that a notch or the like is caused on the $SiO_2$ film and the density of the $SiO_2$ film is lowered.

Moreover, the depositing surface of a substrate is exposed to hexamethyldisilazane (HMDS) while heating the substrate before forming an $SiO_2$ film on the substrate by the thermal CVD using a gas mixture of $O_3$ +TEOS.

Therefore, the depositing surface is silylated to be reformed, and thereby the uniformity of the depositing reaction of an $SiO_2$ film is increased. Thus, the smoothness can be improved without decreasing the $O_3$ concentration in $O_2$.

In conclusion, an anomalous deposition of the $SiO_2$ film at a step portion of the substrate is prevented and the $SiO_2$ film containing less moisture or less organic matter and being superior in smoothness is formed.

DESCRIPTION OF THE PREFERRED EMBODIMENT

Embodiments of the present invention will be described hereinafter with reference to the drawings. (1) The first embodiment of a method for forming an SiO$_2$ film of the present invention (i) In the case of using a backing insulating film made of an SiO$_2$ film formed by the plasma CVD using a gas mixture of O$_2$+TEOS FIG. 2A is a sectional view showing a state after a backing insulating film is formed and before an SiO$_2$ film is formed by the thermal CVD method using a gas mixture of O$_3$+TEOS.

Figure 1A:
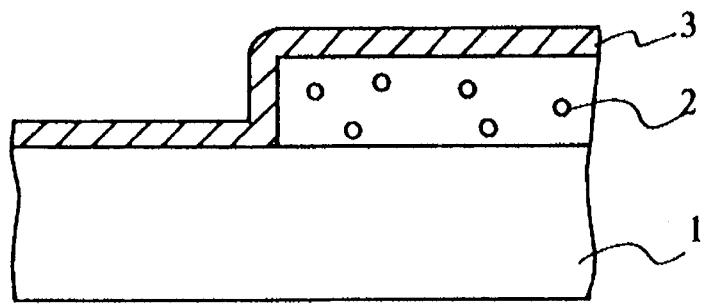
FIGS. 1A and 1B are sectional views showing a prior art of a method for forming an insulating film on a backing insulating film made of an SiO$_2$ film formed by the plasma CVD method.
Figure 1B:
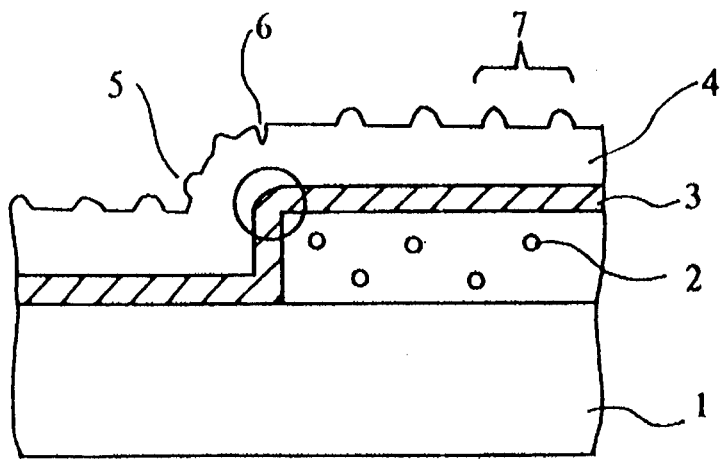
Figure 2A:
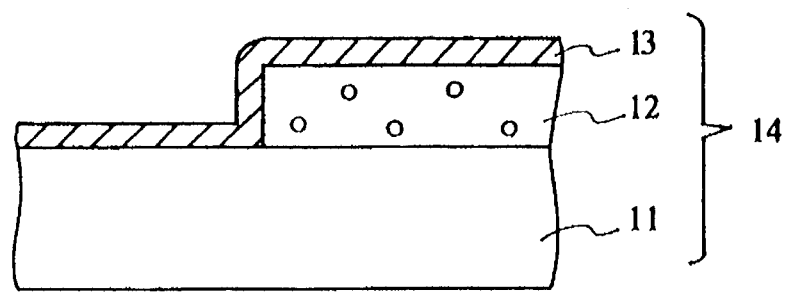
FIGS. 2A to 2C are sectional views showing a first embodiment of the present invention of a method for forming an insulating film on a backing insulating film made of an SiO$_2$ film formed by the plasma CVD method.

In FIG. 2A, 11 represents a silicon substrate, 12 represents an interconnection layer made of an aluminum film with a thickness of approx. 6000 Å formed on the silicon substrate 11, and 13 represents a backing insulating film made of an SiO$_2$ film with a thickness of approx. 2000 Å for covering the interconnection layer 12. The SiO$_2$ film serving as the backing insulating film 13 is formed by the plasma CVD using a gas mixture of O$_2$+TEOS. The above elements constitute a substrate 14.

The thermal CVD is a method such that a gas mixture of O$_3$ and TEOS reaches the surface of the substrate 14 maintained at a deposition temperature, these reaction gases react on the surface of the substrate at the temperature, and an SiO$_2$ film is deposited on the surface. As such, because the deposition by the thermal CVD using a gas mixture of O$_3$ and TEOS results from the surface reaction, the reaction greatly depends on the property of the depositing surface of the substrate 14 and greatly affects the shape and quality of an SiO$_2$ film to be formed. Therefore, the step of reforming the depositing surface of the substrate 14 is carried out before forming an SiO$_2$ film by the thermal CVD.

First, the substrate 14 is mounted on a substrate placing table in the chamber of a CVD apparatus.

Then, a following pretreatment is performed to reform the depositing surface of the substrate 14 before forming an SiO$_2$ film on it.

The substrate 14 is heated with a heater to be maintained at 400° C. which is equal to a deposition temperature, and then only TEOS gas is introduced into the chamber at a flow rate of approx. 1.5 liter/min to expose the substrate 14 to the TEOS gas. This state is maintained for a predetermined period. For comparison, there are prepared five types of substrates which are pretreated for 0, 5, 10, 20, and 30 sec as the predetermined period. The substrate 14 pretreated for 10 sec is described below as a typical sample.

Then, to form an SiO$_2$ film on the pretreated substrate 14 O$_3$ gas in addition to TEOS is introduced into the chamber at a flow rate of approx. 7.5 liter/min while keeping the temperature of the substrate 14 at 400° C. In this case, O$_3$ gas is contained in O$_2$ gas at the concentration of 5%.

Thereby, a reaction between O$_3$ and TEOS starts and deposition of an SiO$_2$ film on the backing insulating film 13 is started. After a predetermined time passes, an SiO$_2$ film {NSG film (Non-doped Silicate Glass Film)} 15 with a thickness of approx. 4000 Å is formed on the backing insulating film 13. An NSG film does not contain boron or phosphorus unlike a PSG film (phosphosilicate glass film) or a BPSG film (boro-phosphosilicate glass film).

Then, the coverage and smoothness of the SiO$_2$ film 15 formed above was examined. For comparison, the coverage and smoothness of the SiO$_2$ film 35 formed on the substrate 34, which has same constitution as that in FIG. 2A and is not pretreated, is also examined.

Figure 3A:
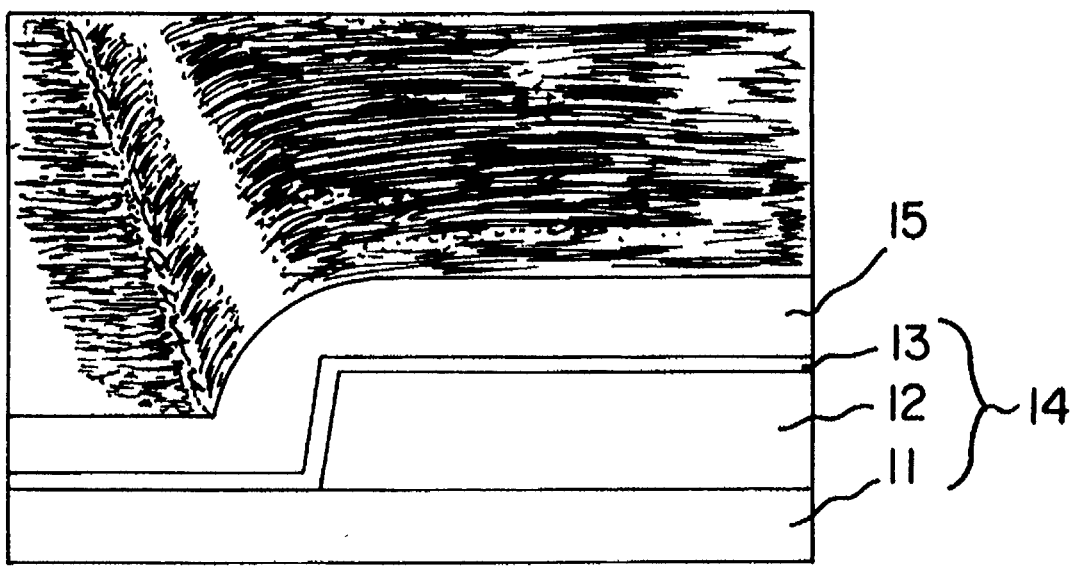
FIGS. 3A and 3B are copies of photographs taken by observing through a scanning electron microscope (hereinafter referred to as SEM) an SiO$_2$ film formed on a backing insulating film made of an SiO$_2$ film formed by the plasma CVD method according to the first embodiment of the present invention.
Figure 3B:
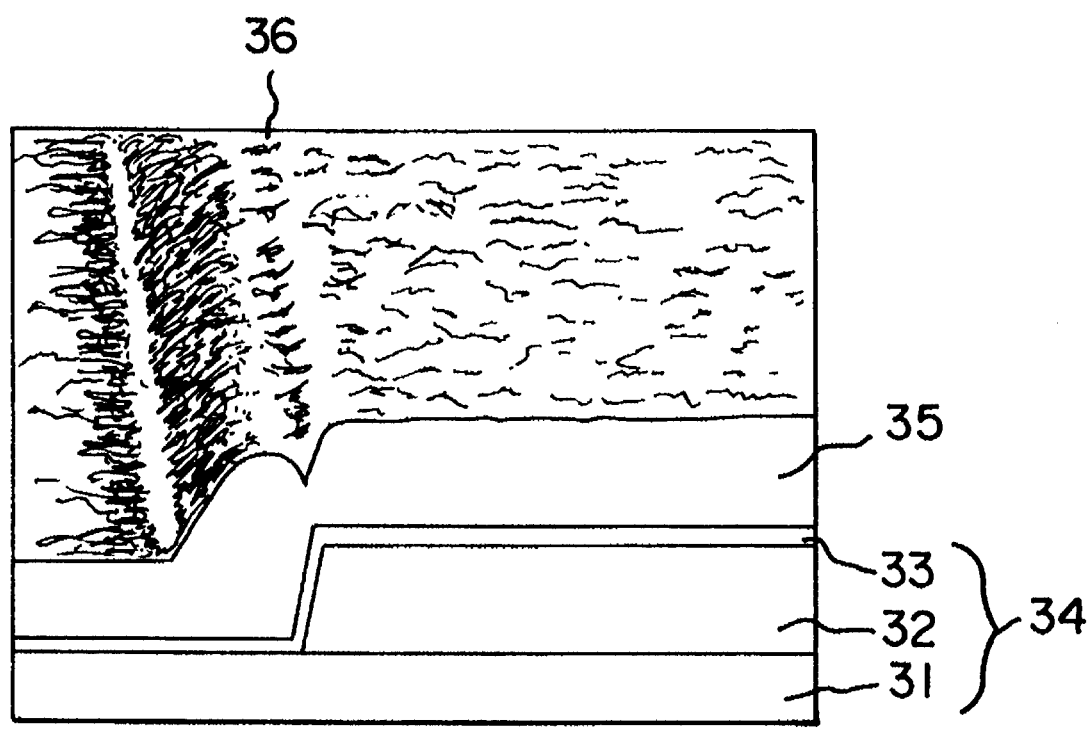

FIGS. 3A and 3B show the examination results. FIG. 3A shows a photograph taken by observing through SEM the SiO$_2$ film 15 formed on the substrate 14 pretreated for 10 sec, and FIG. 3B shows a photograph taken by observing through SEM the SiO$_2$ film 35 formed on the substrate 34 which was not pretreated.

According to the results, it is found that no anomalous deposition occurs even at a step portion for the SiO$_2$ film 15 formed on the substrate 14 pretreated for 10 sec as shown in FIG. 3A.

For the SiO$_2$ film 35 formed on the non-pretreated substrate 34, however, an anomalous deposition occurs at a step portion more or less to cause a notch or hollow 36. Moreover, the surface of the SiO$_2$ film 35 has a lot of ruggedness and its smoothness is not good.

To examine a reason causing these differences, the depositing surface of the pretreated substrate is examined by means of XPS (X-ray Photoelectron Spectroscopy) and FTIR (Fourier Transform Infrared Spectroscopy).

According to the examination results, it is found that a covering layer with a thickness of approx. 30 Å containing CHx and CO is formed on the SiO$_2$ film (backing insulating film) 13 of the substrate 14 pretreated for 10 sec and the depositing surface of the SiO$_2$ film 13 has hydrophobicity. For the surface of the non-pretreated substrate 34, however, it is found that no covering layer is formed or only a thin covering layer is formed.

Figure 10A:
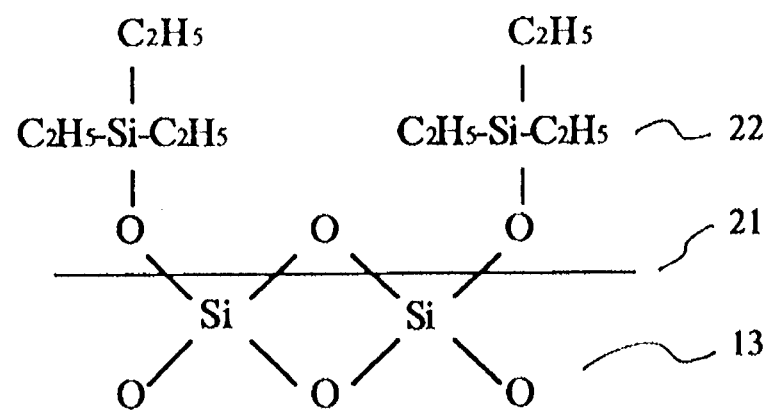
FIGS. 10A and 10B are illustrations showing combination states of atoms and molecules on depositing surfaces of SiO$_2$ films (backing insulating films) which are formed by the plasma CVD and thereafter surface-treated according to the first and second embodiments of the present invention.

Therefore, in the case of the substrate 14 pretreated for 10 sec, it is estimated that the depositing surface 21 is covered with the covering layer 22 shown in FIG. 10A to be reformed because the substrate 14 is exposed to TEOS gas and thereby the film forming reaction on the surface of the backing insulating film 13 is made uniformly smooth.

For the non-pretreated substrate 34, however, it is estimated that the film forming reaction hardly occurs on the surface of the backing insulating film 33, particularly at a step portion of a corner of the interconnection layer 32 because the depositing surface is not adequately reformed.

(ii) In the case of using a backing insulating film made of an SiN film

Figure 4A:
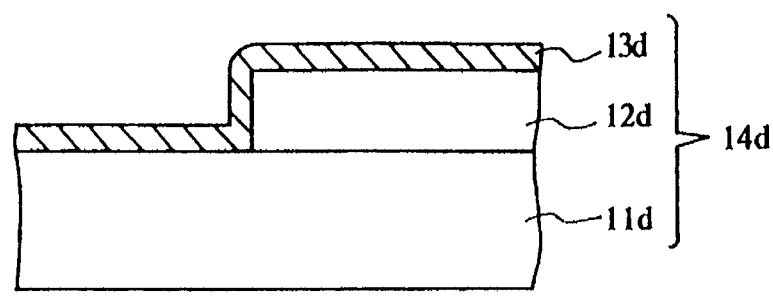
FIGS. 4A to 4C are sectional views showing a first embodiment of the present invention of a method for forming an insulating film on a backing insulating film made of an SiN film.

FIG. 4A is a sectional view showing a state after a backing insulating film is formed and before an SiO$_2$ film is formed by the thermal CVD method using a gas mixture of O$_3$ +TEOS.

In FIG. 4A, 11$d$ represents a silicon substrate, 12$d$ represents an interconnection layer made of aluminum with a thickness of approx. 5000 Å formed on the silicon substrate 11$d$, and 13$d$ represents a backing insulating film made of an SiN film with a thickness of approx. 600 Å for covering the interconnection layer 12$d$. The backing insulating film 13$d$ is formed by the thermal CVD method using a gas mixture of SiH$_2$Cl$_2$+NH$_3$. These elements constitute the substrate 14$d$.

Figure 2B:
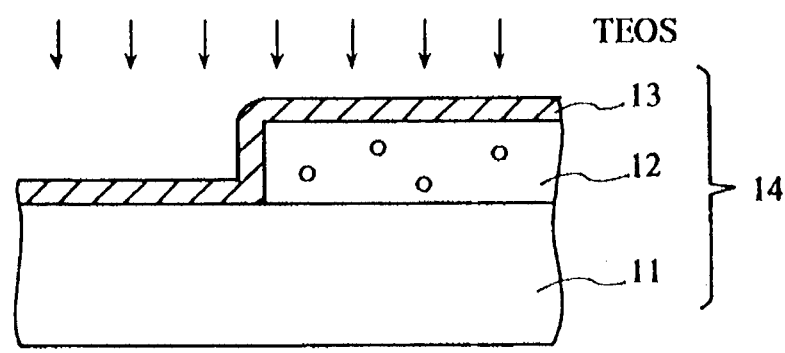
Figure 2C:
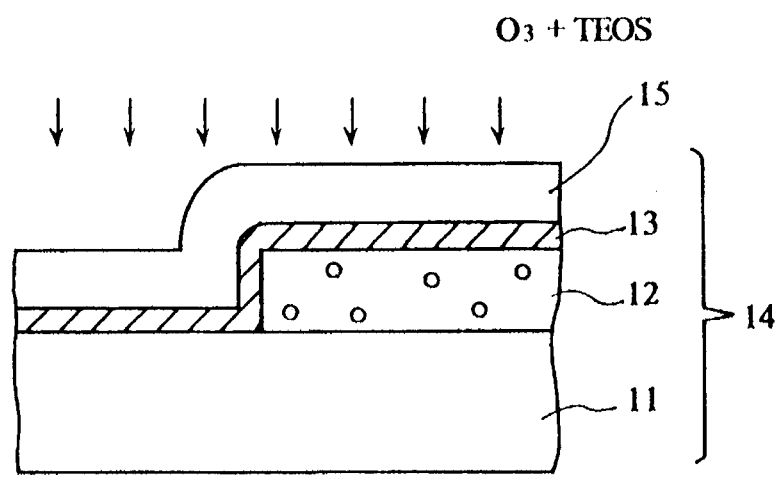
Figure 4B:
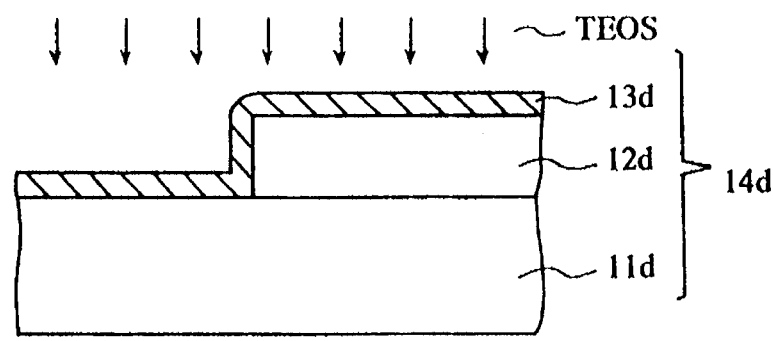
Figure 4C:
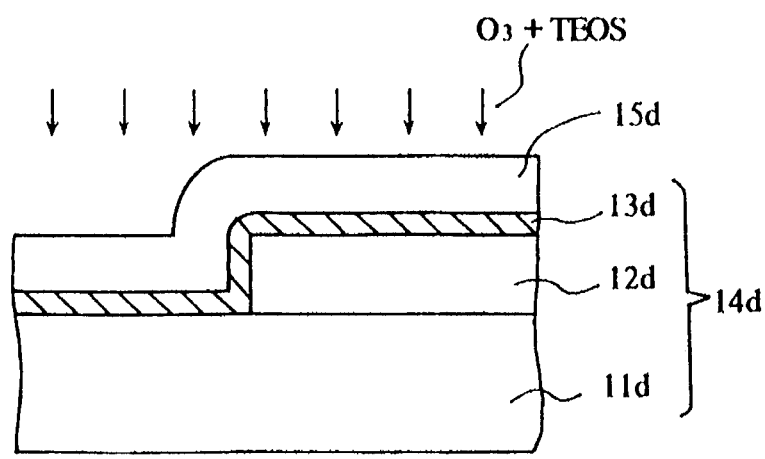
Figure 5A:
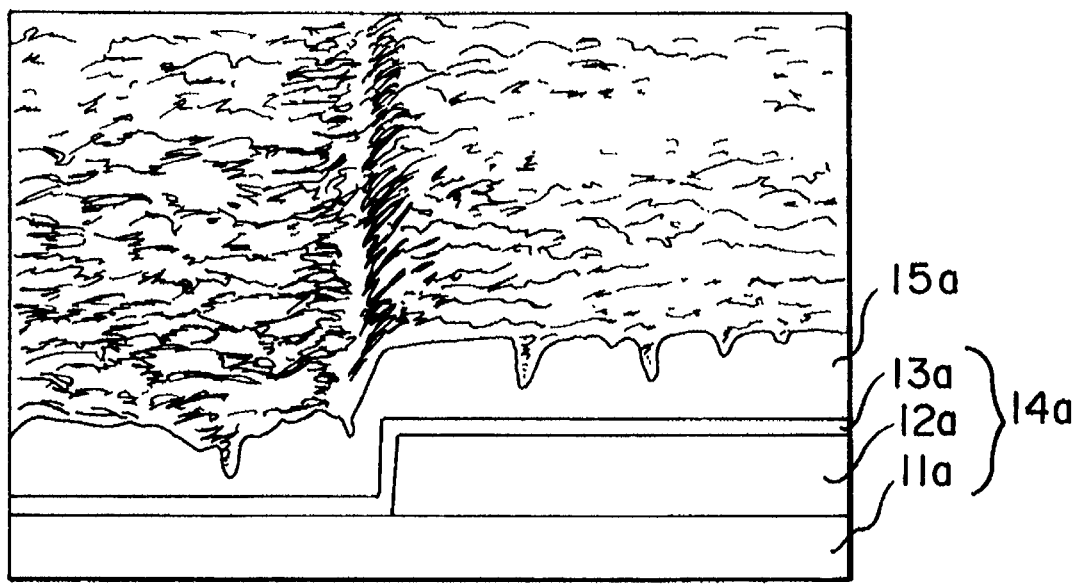
FIGS. 5A and 5B are copies (1) of photographs taken by observing through SEM an SiO$_2$ film formed on a backing insulating film made of an SiN film according to the first embodiment of the present invention.
Figure 5B:
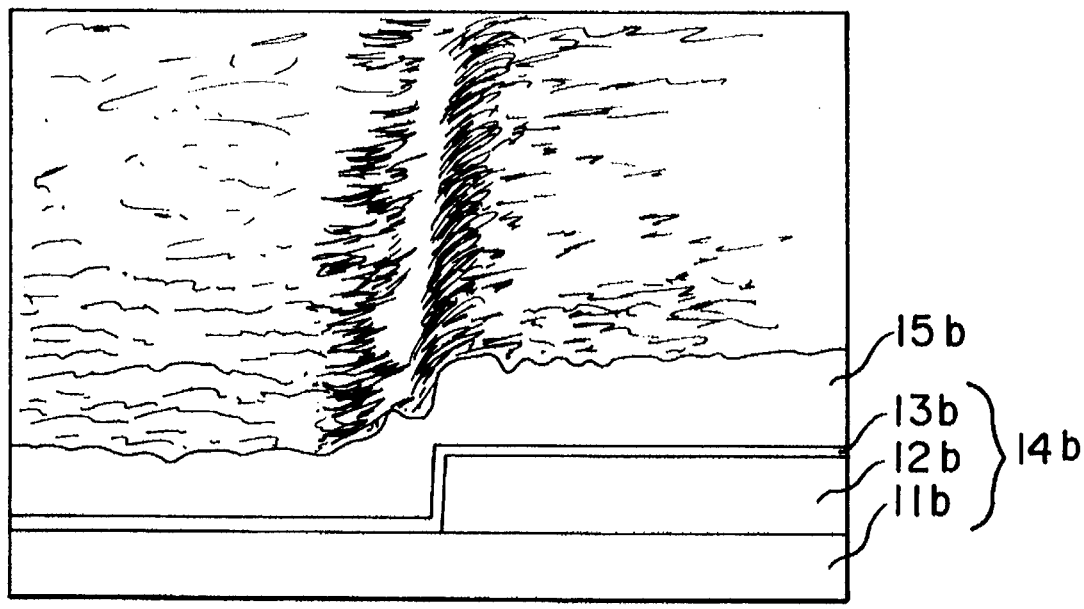
Figure 6A:
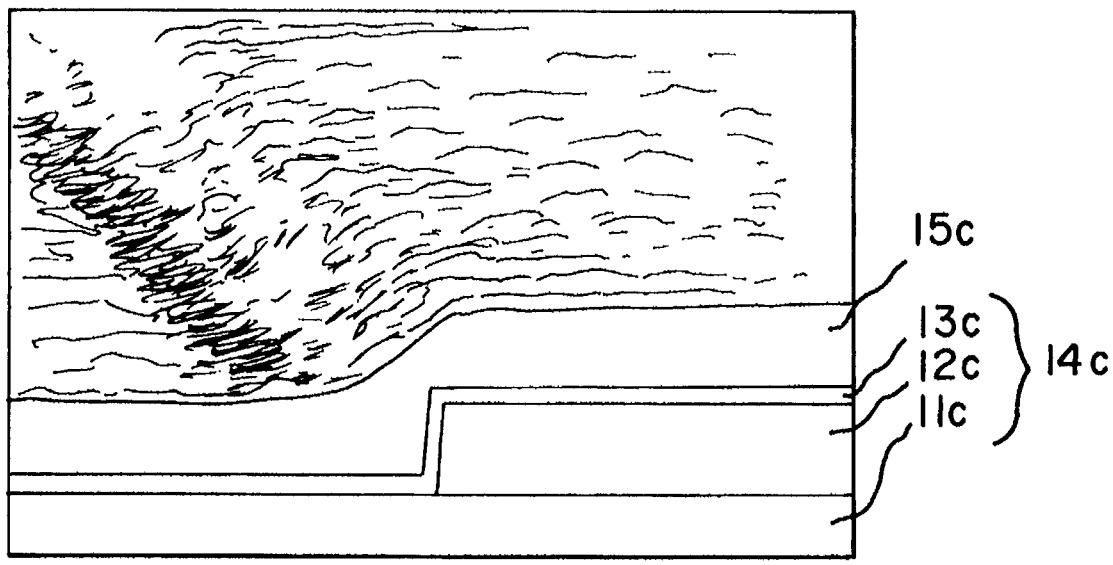
FIGS. 6A and 6B are copies (2) of photographs taken by observing through SEM an SiO$_2$ film formed on a backing insulating film made of an SiN film according to the first embodiment of the present invention.
Figure 6B:
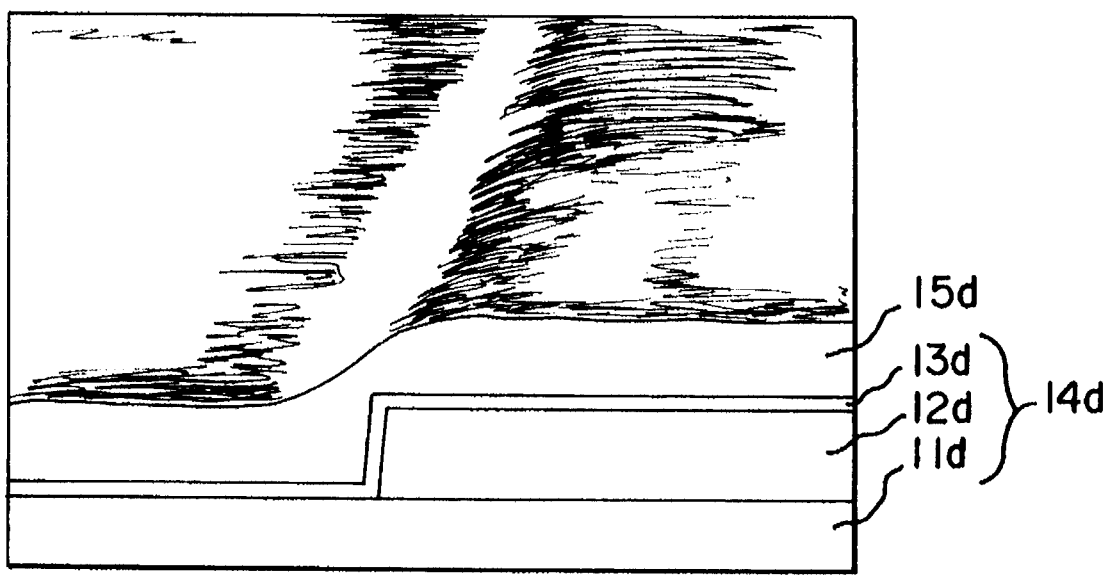

An SiO$_2$ film 15$d$ with a thickness of approx. 5000 Å is formed on the substrate 14$d$ in accordance with steps same as those in FIGS. 2B and 2C (see FIGS. 4B and 4C). In this case, for comparison, substrates 14$a$ to 14$d$ are pretreated for 10, 20, 100, and 200 sec by exposing them to TEOS gas and thereafter SiO$_2$ films 15$a$ to 15$d$ are formed on the substrates 14$a$ to 14$d$.

Besides, an SiO$_2$ film 35$a$ is formed in the same manner as the above on a substrate 34$a$ which has not been pretreated.

Then, the coverage and smoothness of the SiO$_2$ films 15$a$ to 15$d$ and 35$a$ prepared as described above are examined.

Figure 7:
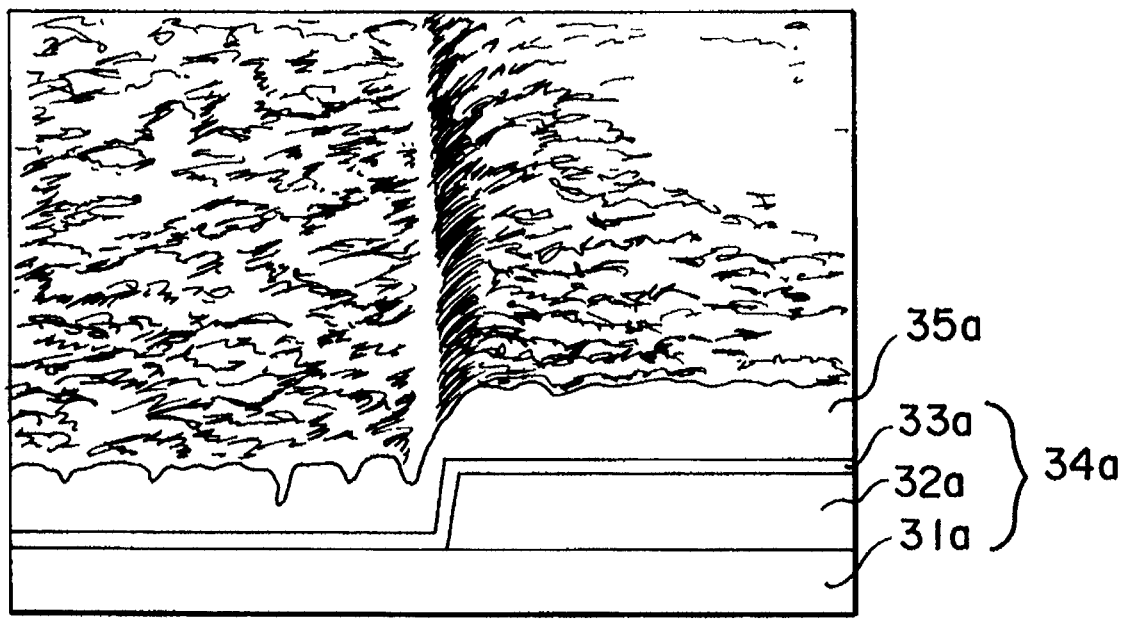
FIG. 7 is a copy (3) of a photograph taken by observing through SEM an SiO$_2$ film formed on a backing insulating film made of an SiN film according to the first embodiment of the present invention.

The examination results are shown in FIGS. 5A, 5B, 6A, 6B, and 7. FIGS. 5A, 5B, 6A, and 6B are copies of SEM photographs of samples pretreated for 10, 20, 100, and 200 sec in this order, and FIG. 7 is a copy of a SEM photograph observing through SEM a sample which is not pretreated.

From the examination results, as shown in FIGS. 5A, 5B, 6A, and 6B, it is found that the smoothness is improved as the pretreatment period of time increases. Particularly for the SiO$_2$ films 15$c$ and 15$d$ formed on the substrates 14$c$ and 14$d$ pretreated for long periods of 100 and 200 sec in this order, no anomalous deposition is observed at a corner of a step portion. For the SiO$_2$ films 35$a$, 15$a$, and 15$b$ formed on the substrates 34$a$, 14$a$, and 14$b$ pretreated for short periods of 0, 10, and 20 sec in this order, however, each of their surfaces has a lot of ruggedness, and particularly an anomalous deposition occurs at a step portion to cause notches or hollows, This is probably because the depositing surfaces of the substrates 14$c$ and 14$d$ pretreated for a long time are adequately covered with TEOS gas to be reformed and thereby the film forming reaction on the surfaces of the backing insulating films 13$c$ and 13$d$ are uniformly smooth.

For the substrates 34$a$, 14$a$, and 14$b$ pretreated for a short time, however, that probably results from the reason why their depositing surfaces are not reformed because of being not adequately covered with TEOS gas and thereby the film forming reaction on the surfaces of the backing insulating films 33$a$, 13$a$, and 13$b$ occurs non-uniformly. Particularly, because the film forming reaction hardly occurs at a step portion of a corner of an interconnection layer, it is estimated that a film thickness becomes thinner.

As described above, in the case of the first embodiment of the present invention of the method for forming an insulating film in a semiconductor device, the depositing surfaces of the substrates 14 and 14$d$ are treated by TEOS while keeping the substrates 14 and 14$d$ at a predetermined temperature before forming SiO$_2$ films 15 and 15$d$ on the substrates 14 and 14$d$ by the thermal CVD method using a gas mixture of O$_3$ and TEOS.

Therefore, it is possible to reform the depositing surfaces of the substrates 14 and 14$d$ independently of whether it is an SiO$_2$ film formed by the plasma CVD method using a gas mixture of O$_2$+TEOS or an SiN film. Therefore, when forming the SiO$_2$ films 15 and 15$d$ on the substrates 14 and 14$d$ by the thermal CVD using a gas mixture of O$_3$ and TEOS, the uniformity of the film forming reaction on the surfaces of the backing insulating films 13 and 13$d$ is improved. Thus, the smoothness can be improved without decreasing the O$_3$ concentration in O$_2$.

As described above, an anomalous deposition of the SiO$_2$ films 15 and 15$d$ at a step portion or the like of the substrates 14 and 14$d$ is prevented and the SiO$_2$ films 15 and 15$d$ containing less moisture and less organic matter and being superior in smoothness are formed.

(2) The second embodiment of the present invention is a method for forming an insulating film in a semiconductor device The second embodiment is different from the first embodiment in that the depositing surface of a substrate is pretreated with HMDS while keeping the substrate at a predetermined temperature before forming an SiO$_2$ film on the substrate by the thermal CVD method using a gas mixture of O$_3$+TEOS.

Figure 8A:
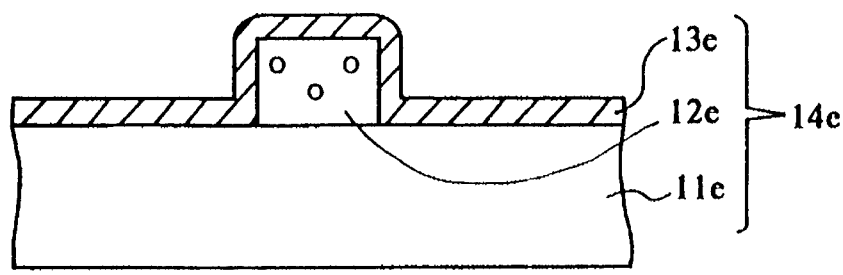
FIGS. 8A to 8C are sectional views showing the second embodiment of the present invention of a method for forming an insulating film on a backing insulating made of an SiO$_2$ film formed by the plasma CVD method.

FIG. 8A is a sectional view showing a state after a backing insulating film 13$e$ is formed and before an SiO$_2$ film 15$e$ is formed by the thermal CVD method using a gas mixture of O$_3$+TEOS.

In FIG. 8A, 11$e$ represents a silicon substrate, 12$e$ represents an interconnection layer made of aluminum with a thickness of approx. 8000 Å on a silicon substrate 11$c$, and 13$e$ represents a backing insulating film made of an SiO$_2$ film with a thickness of approx. 5000 Å for covering the interconnection layer 12$e$. The SiO$_2$ film serving as the backing insulating film 13$e$ is formed by the plasma CVD method using a gas mixture of O$_2$+TEOS. These elements constitute a substrate 14$e$.

First, the substrate 14$e$ is mounted on the substrate placing table in the chamber of a CVD apparatus. Then, the substrate 14$e$ is heated with a heater to be kept at 110° C.

Figure 8B:
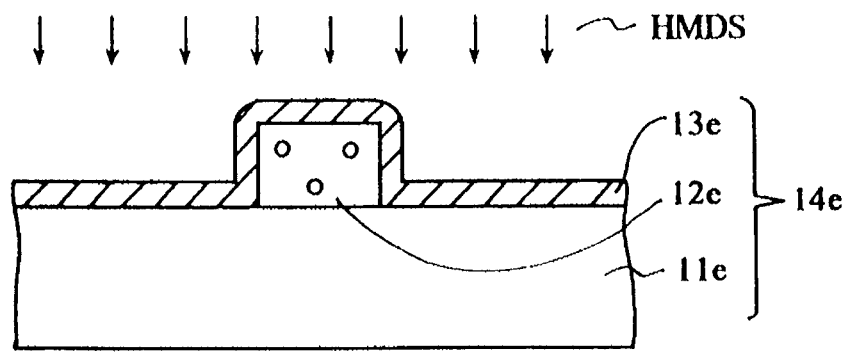

Then, as shown in FIG. 8B, HMDS gas is introduced into the chamber at a flow rate of approx. 3 liter/min to expose the substrate 14$e$ to the HMDS gas. This state is continued for 3 min.

Then, TEOS gas and O$_3$ gas are introduced into the chamber at flow rates of approx. 1.5 and 7.5 liter/min respectively while the substrate 14$e$ is heated with the heater to be maintained at the deposition temperature of 400° C.

Figure 8C:
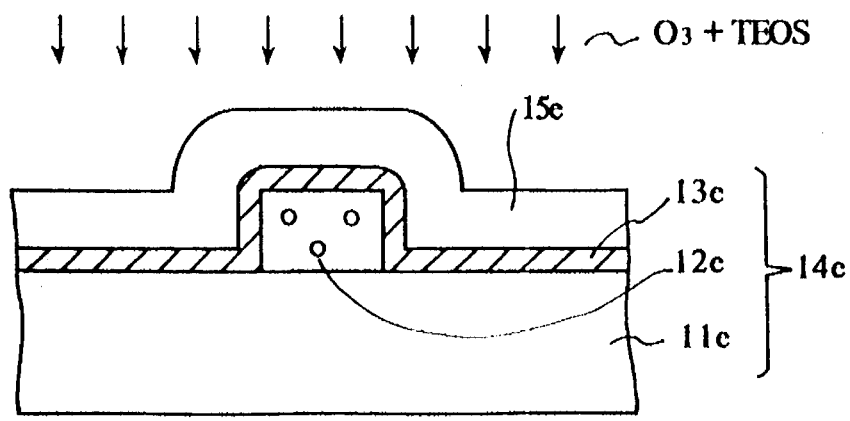

Thereby, as shown in FIG. 8C, the reaction between O$_3$ and TEOS starts and a deposition of an SiO$_2$ film on the backing insulating film 13$e$ is started. After a predetermined time passes, an SiO$_2$ film 15$e$ with a thickness of approx. 4000 Å is formed on the backing insulating film 13$e$.

Then, the coverage and smoothness of the $SiO_2$ film 15e formed in the above manner are examined. For comparison, the coverage and smoothness of a $SiO_2$ film formed on a substrate, which has same constitution as that in FIG. 2A and is not pretreated, are also examined.

Figure 9:
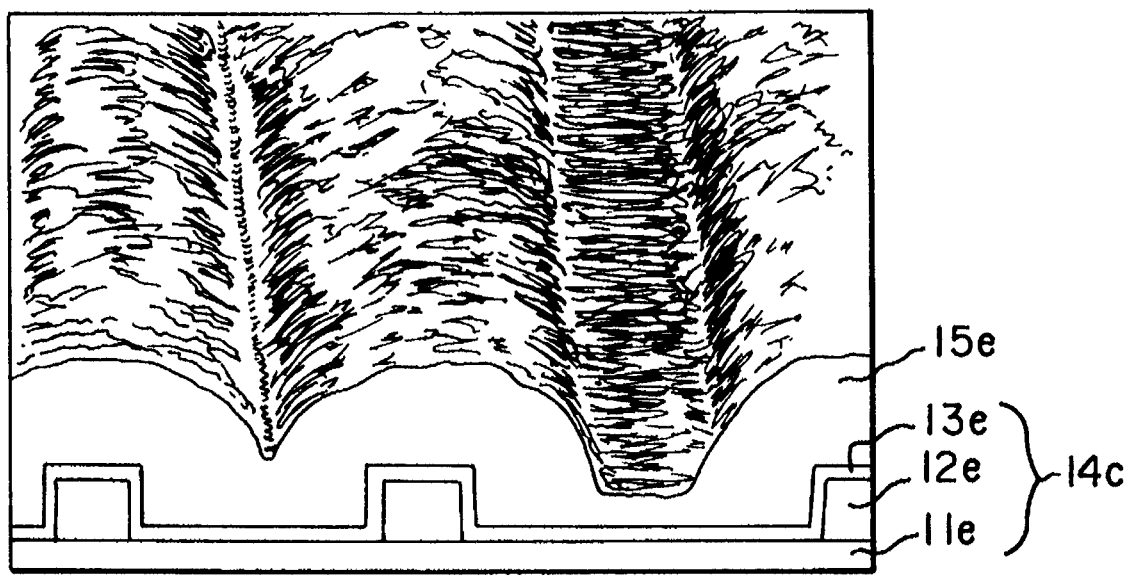
FIG. 9 is a copy of a photograph taken by observing through SEM an SiO$_2$ film formed on a backing insulating film made of an SiN film according to the first embodiment of the present invention.

Examination results are shown in FIG. 9. FIG. 9 is a copy of a photograph taken with observing a sample through SEM.

From the examination results, no anomalous deposition is observed at a corner of a step portion of the $SiO_2$ film 15e formed on the substrate 14e.

Figure 10B:
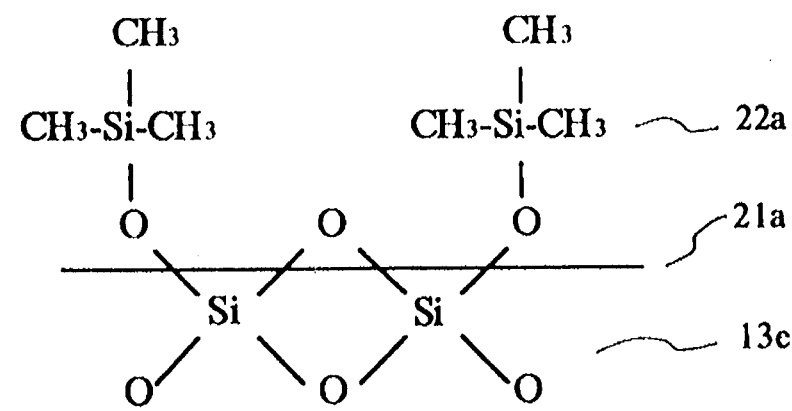

This is probably because the covering layer 22a is formed on the depositing surface 21a by being exposed to HMDS gas and thus the depositing surface 21a is silylated to be reformed as shown in FIG. 10B and thereby the film forming reaction on the surface of the backing insulating film 13e is uniformly smooth.

As described above, in the case of the present invention of the method for forming an insulating film in a semiconductor device, the substrate 14e is maintained at a predetermined temperature and the depositing surface of the substrate 14e is treated with HMDS gas before forming the $SiO_2$ film 15e on the substrate 14e by the thermal CVD using a gas mixture of $O_3$ and TEOS.

Therefore, it is possible to silylate and reform the depositing surface of the substrate 14e independently of whether it is an $SiO_2$ film formed by the plasma CVD method using a gas mixture of $O_2$+TEOS or an SiN film. Thus, when forming the $SiO_2$ film 15e on the substrate 14e by the thermal CVD using a gas mixture of $O_3$ and TEOS, the uniformity of the film forming reaction on the surface of the backing insulating film 13e is improved. Accordingly, the smoothness can be improved without decreasing the $O_3$ concentration in $O_2$.

Thereby, an anomalous deposition of the $SiO_2$ film 15e at a step portion or the like of the substrate 14e is prevented and the $SiO_2$ film 15e containing less moisture and less organic matter and being superior in smoothness is formed.

The above second embodiment is applied to a case of using the backing insulating film 13e made of an $SiO_2$ film formed by the plasma CVD method using a gas mixture of $O_2$+TEOS. Moreover, the second embodiment can also be applied to a case of using the backing insulating film 13e made of an SiN film.

What is claimed is:

1. A method for forming an insulating film in a semiconductor device, comprising the steps of:

exposing a depositing surface of a substrate to tetraethoxy silane in the absence of ozone and oxygen gas at an elevated temperature which is sufficient to cause said depositing surface to be re-formed into a more uniformly smooth surface; and thereafter forming an oxide film on the substrate by a thermal chemical vapor deposition using a gas mixture of ozone and tetraethoxy silane at a deposition temperature which is sufficient to cause deposition of $SiO_2$.

2. The method for forming an insulating film in a semiconductor device according to claim 1, wherein said elevated temperature is equal to said deposition temperature.

3. The method for forming an insulating film in a semiconductor device according to claim 1, wherein in said exposing step said depositing surface comprises an $SiO_2$ film formed by a plasma CVD method using a gas mixture of oxygen and tetraethoxy silane.

4. The method for forming an insulating film in a semiconductor device according to claim 3, wherein the exposing step comprises exposing the substrate to tetraethoxy silane for 100 sec or more at 400° C. or higher.

5. The method for forming an insulating film in a semiconductor device according to claim 1, wherein said depositing surface comprises a SiN film formed by a thermal CVD using a gas mixture of $SiH_2Cl_2$+$NH_3$.

6. The method for forming an insulating film in a semiconductor device according to claim 5, wherein the exposing step comprises exposing the substrate to tetraethoxy silane for 100 sec or more at 400° C. or higher.

7. A method for forming an insulating film in a semiconductor device comprising the steps of:

exposing a depositing surface of a substrate to hexamethyldisilazane in the absence of ozone at an elevated temperature which is sufficient to cause said depositing surface to be reformed into a more uniformly smooth surface; and forming an oxide film on the substrate by a thermal CVD method using a gas mixture of ozone and tetraethoxy silane at a deposition temperature which is sufficient to cause deposition of $SiO_2$.

8. The method for forming an insulating film in a semiconductor device according to claim 7, wherein in said exposing step said depositing surface comprises an $SiO_2$ film formed by a plasma CVD method using a gas mixture of oxygen and tetraethoxy silane.

9. The method for forming an insulating film in a semiconductor device according to claim 8, wherein the exposing step comprises exposing the substrate to hexamethyldisilazane for 3 min or more at 110° C. or higher.

10. The method for forming an insulating film in a semiconductor device according to claim 7, wherein said depositing surface comprises a SiN film formed by a thermal CVD method using a gas mixture of $SiH_2Cl_2$+$NH_3$.

11. The method for forming an insulating film in a semiconductor device according to claim 10, wherein the exposing step comprises exposing the substrate to hexamethyldisilazane for 3 min or more at 110° C. or higher.

* * * * *